United States Patent
Maruyama et al.

[11] Patent Number: 6,114,798
[45] Date of Patent: *Sep. 5, 2000

[54] STACKED ELEMENT AND VIBRATION DRIVE DEVICE

[75] Inventors: Yutaka Maruyama, Tokyo; Nobuyuki Kojima, Yokohama; Toru Ezaki, Tokyo; Takahiro Yamakawa, Konosu, all of Japan

[73] Assignees: Canon Kabushiki Kaisha; Taiheiyo Cement Corporation, both of Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/829,897

[22] Filed: Mar. 25, 1997

[30] Foreign Application Priority Data

Mar. 25, 1996 [JP] Japan .................................. 8-068354

[51] Int. Cl.[7] .............................. H02N 2/00; H01L 41/08
[52] U.S. Cl. .................. 310/323.06; 310/328; 310/331; 310/365; 310/366; 310/359
[58] Field of Search ...................... 310/364, 331, 310/365, 366, 323.02, 323.06, 328, 359

[56] References Cited

U.S. PATENT DOCUMENTS

| | | | |
|---|---|---|---|
| 4,027,209 | 5/1977 | Maher | 361/361 |
| 4,087,716 | 5/1978 | Heywang | 310/332 |
| 4,426,356 | 1/1984 | Nair | 419/21 |
| 4,431,935 | 2/1984 | Rider | 310/331 |
| 4,438,364 | 3/1984 | Morison | 310/328 |
| 4,533,899 | 8/1985 | Schnell | 310/330 |
| 4,568,384 | 2/1986 | Maher | 75/0.5 R |
| 4,812,698 | 3/1989 | Chida et al. | 310/330 |
| 5,233,260 | 8/1993 | Harada et al. | 310/328 |
| 5,391,223 | 2/1995 | Dougherty | 106/1.19 |
| 5,457,630 | 10/1995 | Palmer | 364/424.03 |
| 5,523,645 | 6/1996 | Inoi | 310/364 |
| 5,548,179 | 8/1996 | Kaida | 310/367 |
| 5,687,055 | 11/1997 | Miki | 361/305 |
| 5,914,556 | 6/1999 | Tabota et al. | 310/328 |

*Primary Examiner*—Thomas M. Dougherty
*Attorney, Agent, or Firm*—Fitzpatrick, Cella, Harper & Scinto

[57] ABSTRACT

A vibration drive device including a stack element in which a plurality of layers of an electromechanical energy transducing material and layers of an electrode material are stacked alternately, and a vibrating body is arranged to vibrate with vibration of the stack. The electrode material contains silver in a metal component and the silver is less than 50% by weight.

17 Claims, 7 Drawing Sheets

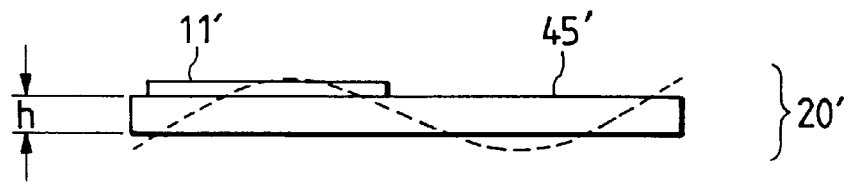
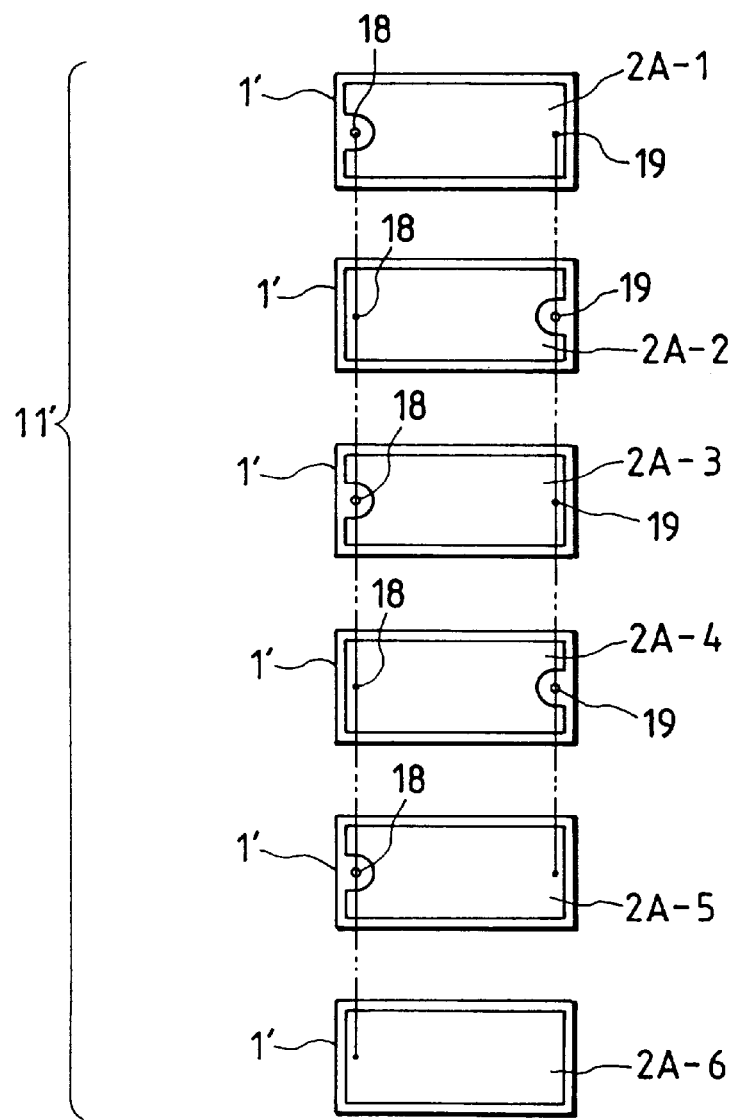

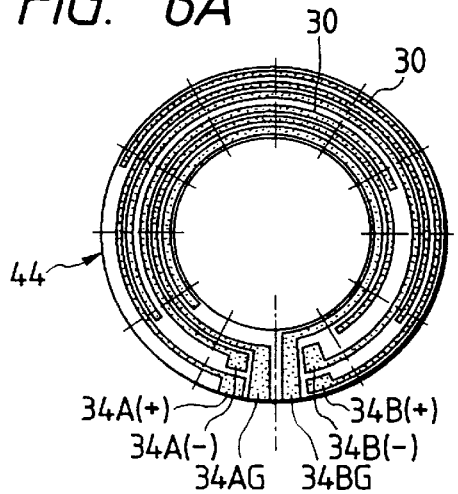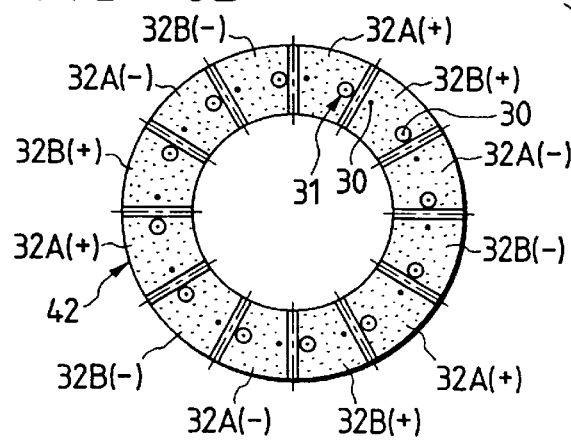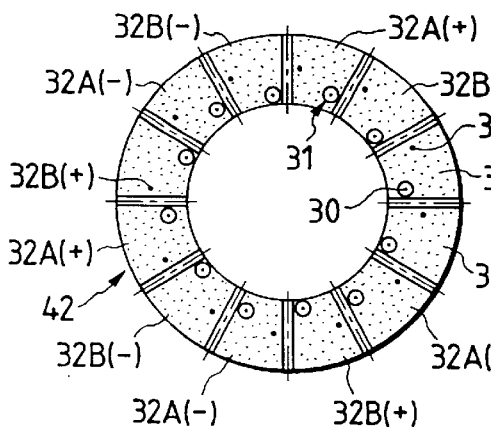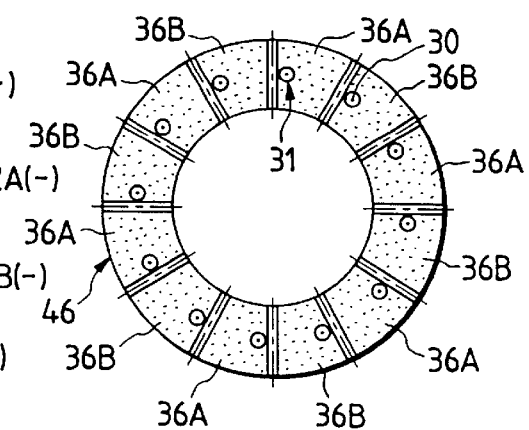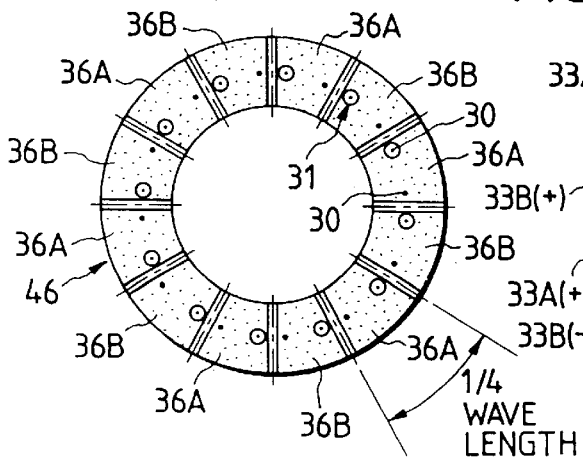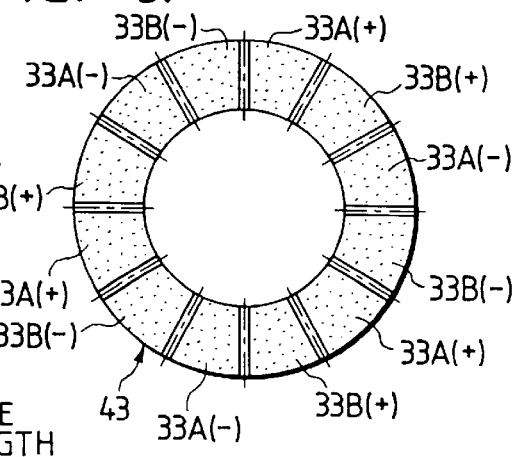

STACKED ELEMENT AND VIBRATION DRIVE DEVICE

BACKGROUND OF THE INVENTION

1. Field of the Invention

The present invention relates to a transducing element of a stack (laminate) type for transducing electric energy to mechanical energy and also relates to a vibration drive device using the transducing element.

2. Related Background Art

For example, in electromechanical transducing materials of piezoelectric ceramics or the like having the electromechanical transducing capability, there is a conventionally proposed stack (laminate) element with alternate lamination of electrode material and piezoelectric ceramic.

When compared, for example, with a single piezoelectric ceramic plate having the same thickness, this stack (laminate) element can achieve greater deformation strain and greater generating force with a lower voltage applied thereto and, therefore, it is utilized or investigated in recent years, particularly as a drive section of vibrator forming a vibration drive device such as a piezoelectric actuator or a vibration wave motor.

There are typically two methods for fabricating this stack (laminate) element as described below.

The first fabrication method is a method for providing electrode layers on the both surfaces of each baked piezoelectric ceramic ply, stacking (laminating) a plurality of such plies, and bonding them, for example, with an adhesive or the like.

The second fabrication method is a sinter integration method for stacking (laminating) layers of molded sheets (green sheets) containing an organic binder of piezoelectric ceramic before sintering and layers of electrode paste before sintering, thermally pressing then into an incorporated form, and sintering it.

The second fabrication method is drawing attention these years, and can fabricate a compact and higher-performance stack (laminate) element, because the piezoelectric ceramic layers can be formed thinner and because the thermal press can obviate a need for use of the material such as the adhesive. However, the fabrication processes thereof become technically more complex.

The stack (laminate) element will be described referring to FIGS. 10A, 10B and FIG. 11. FIG. 10A is a top plan view of the stack (laminate) element, FIG. 10B an example of transverse cross section, and FIG. 11 a longitudinal cross-sectional view of the stack (laminate) element 11 shown in FIG. 10A and FIG. 10B. A plurality of piezoelectric ceramics 1 forming the stack (laminate) element 11 are formed in a disk shape having the thickness of about 100 μm and having an inner diameter.

On the piezoelectric ceramics 1 an electrode layer 2 or 3 is formed over the almost the entire region of each one surface and an uppermost electrode layer 7 over the uppermost surface. These electrode layers 2, 3, 7 are formed by screen printing of a paste of electrode material over each one surface of piezoelectric ceramic 1.

Another electrode layer 8 is formed over a surface opposite to the electrode layer 3 of the piezoelectric ceramic located in the lowermost of the stacked (laminated) layers. Thicknesses of these electrode layers are usually approximately several μm or less.

After the electrode layers are formed on each of the plural piezoelectric ceramics 1 before sintering, the plural piezoelectric ceramics 1 are stacked (laminated) as aligned at predetermined positions, are thermally pressed, and are sintered integrally, thereby making the stack (laminate) element.

After that, two side electrodes 9, 10 are formed, for example, by baking of silver paste on stacked (laminated) side portions of the stack (laminate) element. Further, lead wires not illustrated are connected each to the side electrodes 9, 10 to enable electric conduction with the outside.

Further, an electric insulation process is conducted with a resin material or the like for achieving electric insulation between the edges of the electrode layers and the outside, thus completing the stack (laminate) element 11.

Here, each of the electrode layers 2 is formed so as to cover almost the entire one surface of piezoelectric ceramic 1. The electrode layers 2 are made electrically conductive with the side electrode 9 at the side surfaces of piezoelectric ceramics 1. The electrode layers 2 are not formed around the side electrode 10 in order to maintain electric insulation to the side electrode 10.

The electrode layer 8 formed on the lowermost layer of piezoelectric ceramic 1 is formed in the same shape as the electrode layers 2 so as to be electrically conductive with the side electrode 9, but so as to be electrically insulated from the side electrode 10.

Similarly, the electrode layers 3 are formed almost over the entire surfaces of piezoelectric ceramics 1 except for the surroundings of the side electrode 9 so as to be electrically conductive with the side electrode 10, but so as to be electrically insulated from the side electrode 9. The electrode layer 7 formed on the uppermost layer of piezoelectric ceramic 1 is also formed so as to be electrically conductive with the side electrode 10, but so as to be electrically insulated from the side electrode 9. Then a polarization process is carried out after the integral sintering.

The arrows in FIG. 11 indicate directions of polarization in the stack (laminate) element. When the side electrode 9 is kept at a positive potential relative to the side electrode 10, the stack (laminate) element is polarized as indicated by the arrows in the draws. When an electric field to make the side electrode 9 positive relative to the side electrode 10 is applied to the stack (laminate) element thus polarized, the stack (laminate) piezoelectric element 11 is deformed to expand in the stack (laminate) direction; when a reverse electric field is applied thereto, the stack (laminate) element is deformed to contract. When an alternating electric field is applied as the electric field, expansion and contraction is repeated so as to induce vibration.

FIG. 12 is a longitudinal cross-sectional view of a bolted Langevin type vibration drive device using the stack (laminate) element 11, which is an example of the vibration drive device. Electrode plates 13 formed of copper plates or the like are placed on both end faces of the stack (laminate) element 11 and vibrating bodies 15 made of a metal material are disposed so as to pinch these stack (laminate) element 11 and electrode plates 13 from both sides.

An insulating sheet 14 made of a resin material is placed between one vibrating body 15 and associated electrode plate 13. These two vibrating bodies 15 and a fasting bolt 12 of a metal material are screwed with each other, thus forming the vibration drive device 20.

When an alternating electric field having a frequency close to the natural frequency in an expansion/contraction mode in the axial direction of the device or close to the resonance frequency in the proximity thereof is placed between the two electrode plates 13, the vibration drive device 20 is driven in a state near the state of resonance, whereby it can generate vibrational energy.

Now, describing the electrode layers formed between the layers of the sintering integration type stack (laminate) element, the electrode layers are formed by applying the electrode paste in a predetermined shape onto the piezoelectric ceramic green sheet of each layer of the stack (laminate) element by the screen printing method to be integrated with the green sheet and baking the integral body to sinter the electrode layers together with the green sheets.

The electrode paste is made by mixing metal particles becoming the electrode material, with an organic binder, a solvent, a filler, and an inorganic additive such as glass. The piezoelectric ceramics usually contain a main ingredient of lead zirconate titanate, and are sintered in the air and lead atmosphere at 1000 to 1300° C. Therefore, the electrode material is selected from very limited materials such as noble metals, for example gold, platinum, palladium, and silver, which are neither melted nor oxidized at the baking temperatures. However, taking the material cost into consideration, it was common to mainly use cheap silver among them.

In applications of the foregoing stack (laminate) element to various vibration applying devices, there are roughly the following two ways of application.

One of them is a way for applying a dc voltage to the stack (laminate) element and statically utilizing displacement thereof or force generated.

The other one is a way for applying an alternating voltage to the device to vibrate the vibration system including the stack (laminate) element and utilizing vibration thereof while keeping the system in a state close to the state of resonance with large amplitude of vibration.

There are many examples of the former relatively well known, but there are little examples of the latter to date. An example of the latter is the bolted Langevin type vibration drive device incorporating the above-stated stack (laminate) element, and another example is a vibration wave motor recently developed.

The present inventors made the stack (laminate) element that was able to be used in the state of resonance and have conducted various investigations using the stack (laminate) element in the vibration wave motor. It was then found that when the vibrating members of the vibration wave motor were vibrated by the stack (laminate) element to be driven in a state close to the state of resonance, the stack (laminate) element using the electrode material containing a large amount of cheap silver as before showed great losses of vibrational energy upon vibration to increase generation of heat, which degraded the performance, is especially efficiency, of the motor.

It is the present status that the stack (laminate) element used in the state of resonance normally needs to be made of a piezoelectric ceramic material with little damping, i.e., of a material with high Q value of so-called mechanical quality factor and that there is no such stack (laminate) element commercially available at present.

Especially, in the stack (laminate) element used for the vibration wave motor, there is out-of-plane bending and torsional deformation in the stack (laminate) surfaces, which causes shear strain in the electrode layers. Therefore, damping of vibrational energy becomes especially extreme.

SUMMARY OF THE INVENTION

One aspect of the invention is a stack (laminate) element sintered in a stack (laminate) of a plurality of layers of a material having the electromechanical energy transducing function and layers of an electrode material, wherein said electrode material contains silver in a metal component and silver is less than 50% by weight, thereby enabling to decrease the energy losses upon drive and, as a result, increasing the output thereof.

The other objects of the present invention will become apparent by the detailed description which follows.

BRIEF DESCRIPTION OF THE DRAWINGS

FIG. 1A and FIG. 1B show the electrode layers of the stack (laminate) element in the first embodiment of the present invention, wherein FIG. 1A is a top plan view thereof and FIG. 1B is a transverse cross-sectional view thereof;

FIG. 3 is a side view of FIG. 2;

FIG. 4 is an exploded perspective view of the stack (laminate) element of FIG. 2;

FIGS. 6A, 6B, 6C, 6D, 6E and 6F are drawings to show the stack (laminate) element of the second embodiment;

FIG. 10A and FIG. 10B show the electrode layers in the conventional example of the stack (laminate) element, wherein FIG. 10A is a top plan view thereof and FIG. 10B is a transverse cross-sectional view thereof;

DETAILED DESCRIPTION OF THE PREFERRED EMBODIMENTS (First Embodiment)

Figure 1A:
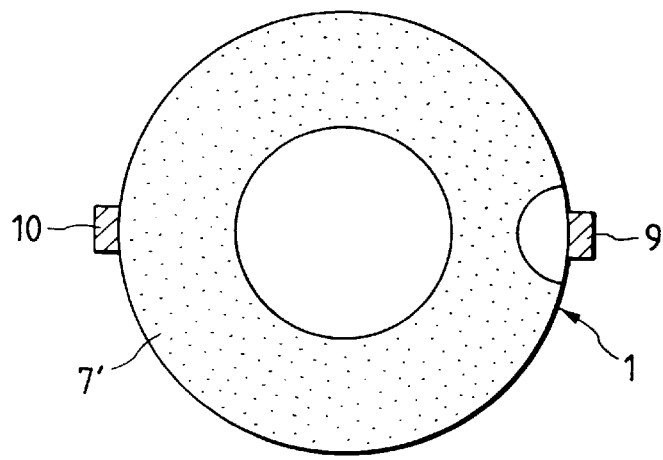
Figure 1B:
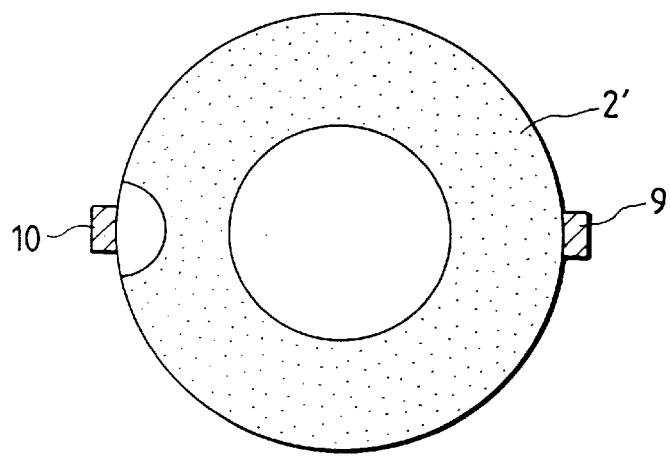

FIG. 1A and FIG. 1B show the stack (laminate) element of the first embodiment, wherein FIG. 1A is a top plan view and FIG. 1B is a transverse cross-sectional view.

Figure 10A:
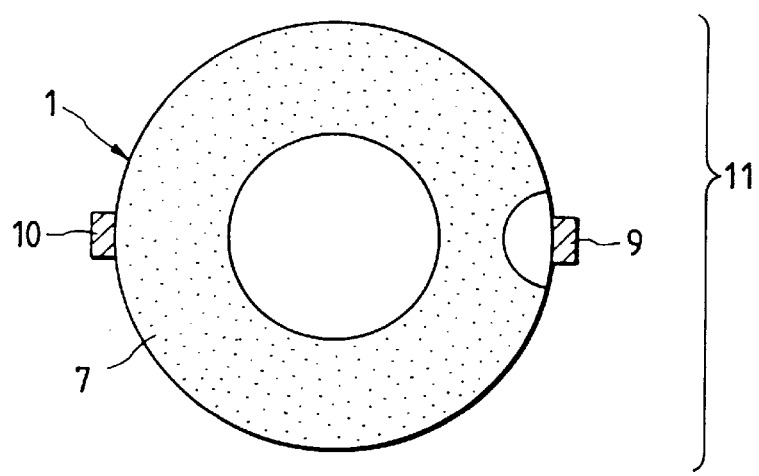
Figure 10B:
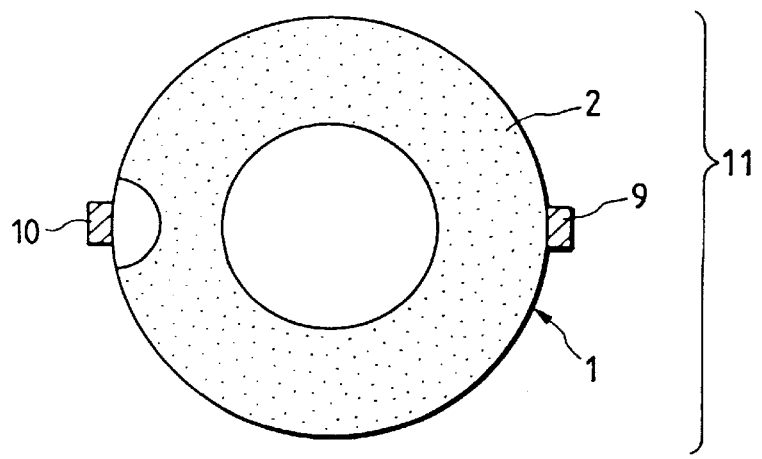
Figure 11:
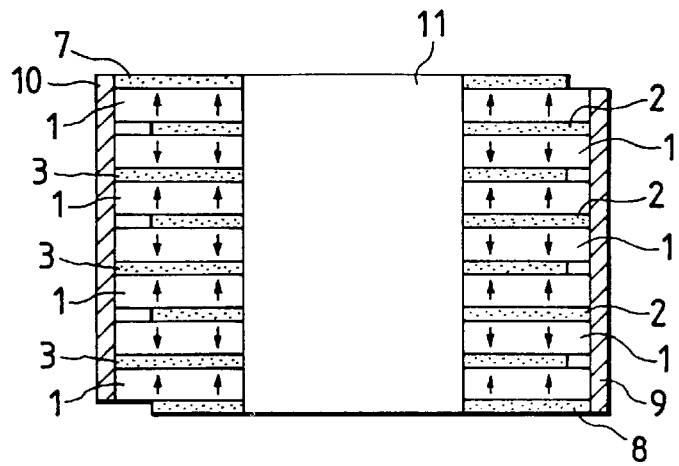
FIG. 11 is a cross-sectional view of FIGS. 10A and 10B.
Figure 12:
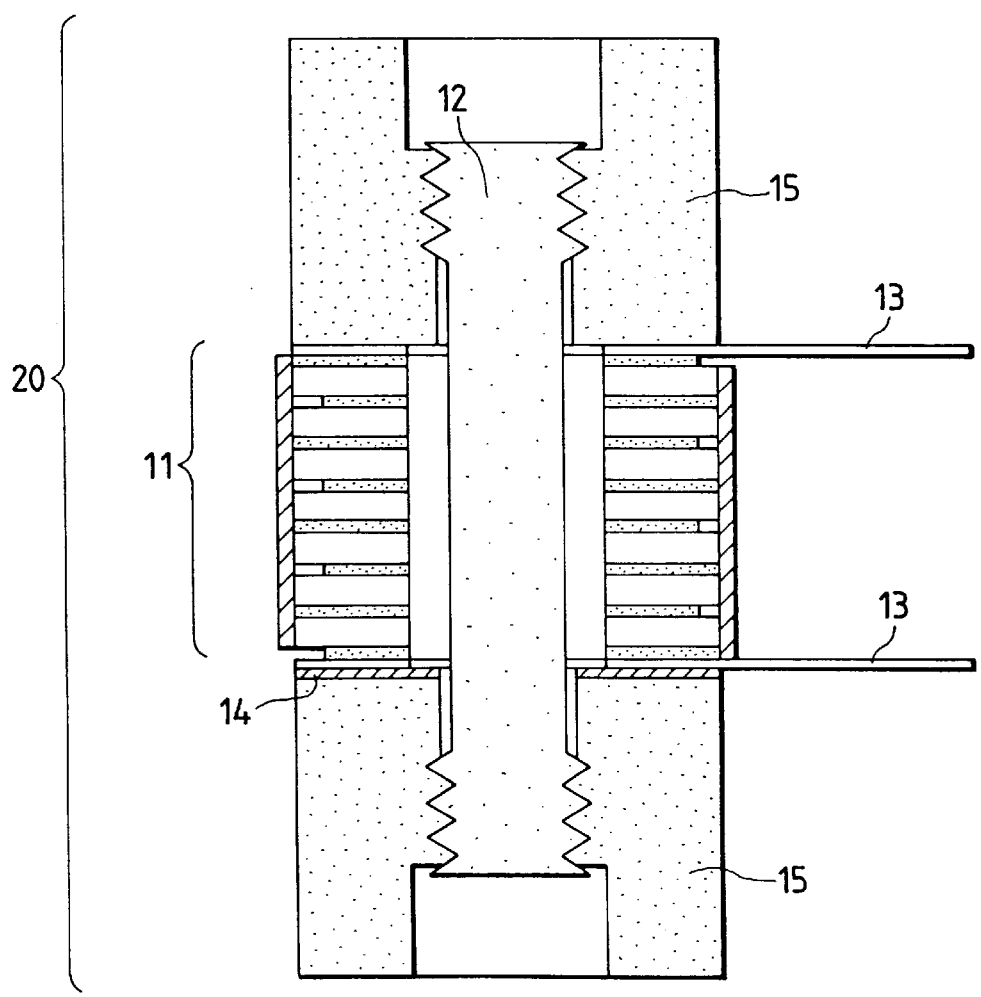
FIG. 12 is a cross-sectional view of the vibration drive device having the stack (laminate) element of the conventional example.

The stack (laminate) element of the present embodiment is constructed of a plurality of stacked (laminated) piezoelectric ceramics 1 having the inner diameter portion, similarly as the conventional stack (laminate) element shown in FIGS. 10A, 10B and FIG. 11 was, and is characterized in the material for the electrode layers 2', 7' provided on either side of piezoelectric ceramic. Since the other structure and the production method thereof are the same, only the material for the electrode layers 2', 7' will be described.

(Example 1)

Figure 2:
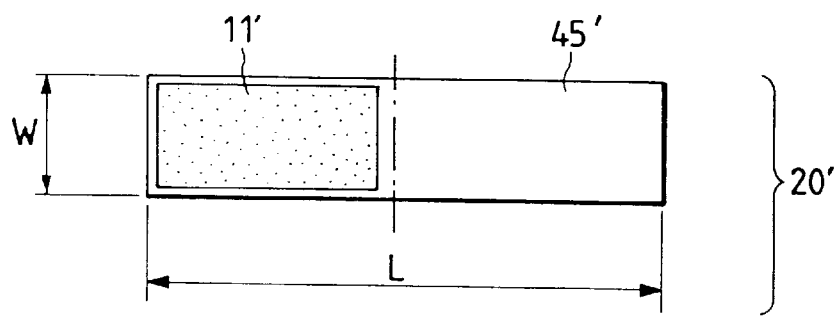
FIG. 2 is a schematic diagram of a vibrating member for evaluation of the stack (laminate) element of the first embodiment.

First, actual evaluation was conducted using the vibrator 20' obtained by fixing the stack (laminate) element 11' having the length (L/2) 15 mm, the width W 7 mm, and the thickness 0.6 mm to a metal plate 45' made of stainless steel SUS 420J2 and in a rectangular shape and having the length L 30 mm, the width W 7 mm, and the thickness h 2 mm with an adhesive, as shown in FIG. 2.

The stack (laminate) element 11' is comprised of six layers of piezoelectric ceramics 1' and six electrode layers 2A as shown in FIG. 4. The vibrator 20' of FIG. 2 was driven in the secondary mode of bending in the thickwise direction as indicated by the dashed line in FIG. 3.

Evaluation was conducted by measuring the mechanical quality factor Q to the amplitude. Specifically, an alternating voltage in the frequency of the secondary mode of bending was applied to the stack (laminate) element to excite it, and then the application of voltage was stopped. Then the time change of amplitude of damped oscillation occurring at that time (which is a damped oscillation curve), which is the time change of amplitude of damped oscillation of the metal plate with the stack (laminate) element fixed thereto, i.e., the vibrator 20', was measured. Then a damping ratio of fixed amplitude was obtained from the damped oscillation curve and the mechanical is quality factor Q was calculated from the damping ratio.

Measurement of amplitude was made by preliminary attaching a piezoelectric ceramic element of single plate as a sensor to the metal plate 45' and checking outputs from the sensor and actual amplitudes.

In the case of measurement with an impedance analyzer normally used for evaluation of piezoelectric element, amplitudes are not constant depending upon the performance of piezoelectric element, and the impedance analyzer varies the admittance depending upon the measurement conditions as well as the conditions upon sweep of measurement voltage, thus having many factors of dispersion upon measurement. When compared with it, the above-stated evaluation method is more excellent in the accuracy of the relation between amplitude and Q value.

There is such a tendency that losses of vibrational energy become greater in the out-of-plane bending amplitude of stack (laminate) surface than in simple vibration normal to the stack (laminate) surface, and the present evaluation method is thus more suitable for measuring losses of stack (laminate) element.

Each electrode layer 2A of the stack (laminate) element 11' is made in the stack (laminate) structure wherein electric conduction is made by through holes obtained by putting the electrode material in holes 18, 19 as shown in FIG. 4. Although not illustrated, lead wires are connected each by soldering to the associated holes 18 and 19 on the uppermost electrode layer 2A-1 and the alternating voltage of appropriate frequency is applied to the wires to vibrate the element.

Q values were measured for different electrode materials by the above measurement method.

Actually used electrode materials were material (1): Au, material (2): Pt, material (3): Pd, material (4): Ag—Pt, and material (5): Ag—Pd (palladium). In the electrode materials of material (4): Ag—Pt and material (5): Ag—Pd, weight ratios of ingredients thereof were determined to be 10:90 (sample 1), 20:80 sample 2), 40:60 (sample 3), 50:50 (sample 4), 60:40 (sample 5), and 80:20 (sample 6).

Here, material (1): Au, material (2): Pt, and material (3): Pd showed relatively large Q values approximately comparable to those of material (4): Ag—Pd (20:80) and the piezoelectric ceramic of single plate for comparison, but the electrode layers of Pt (material (4)) and Pd (material (5)) with a lot of Ag mixed therein showed a drop in the Q value.

Figure 5:
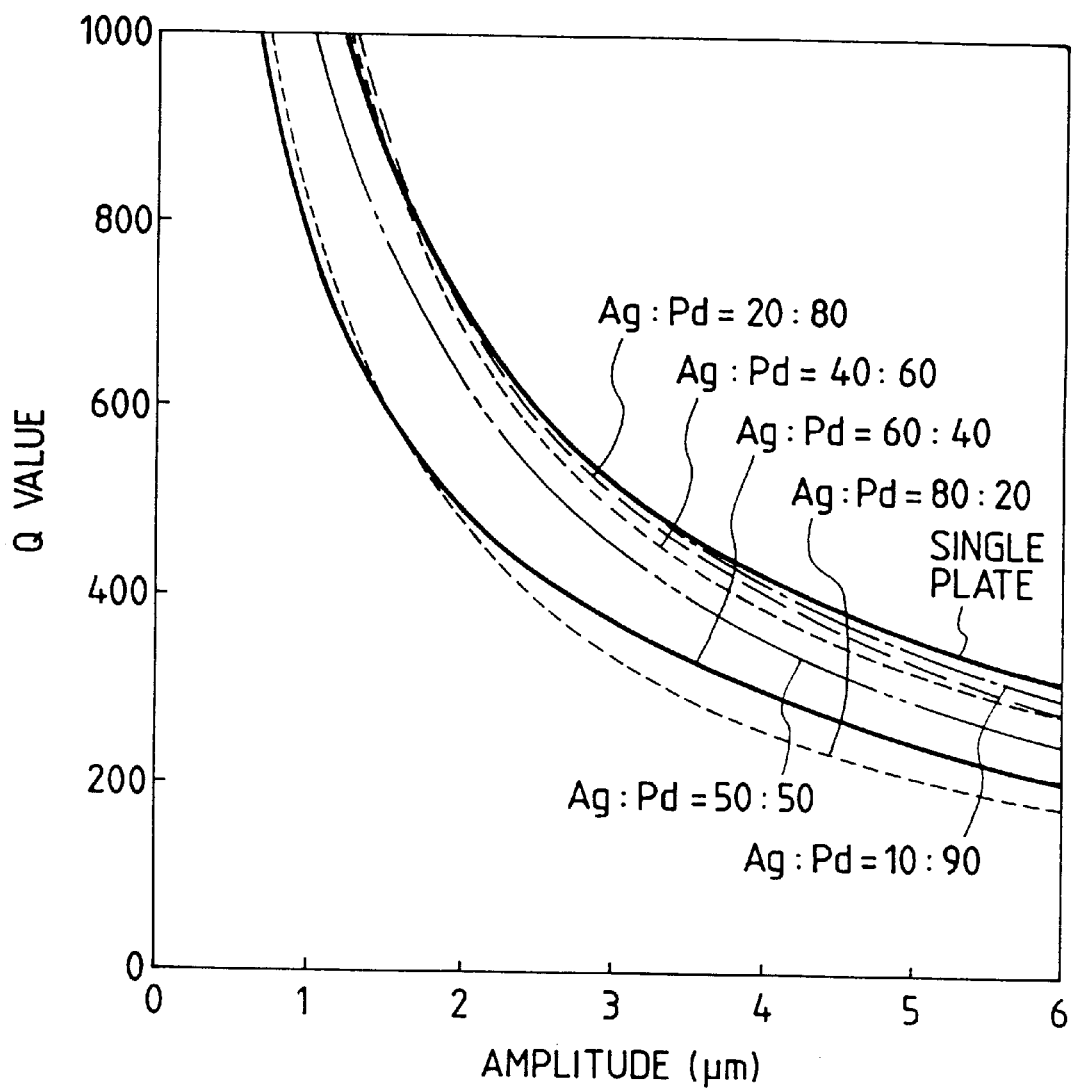
FIG. 5 is a drawing to show the relationship between amplitude and Q value of the stack (laminate) element of Example 1.

FIG. 5 shows results of sample 1 to sample 6 of Ag—Pd of material (5).

Although there was some dispersion in the results, the electrode layers with a lot of Ag mixed (sample 5 and sample 6) showed a great drop in the Q value, which was also the case with Ag—Pt. It was also found that 100% of Pd (palladium) was susceptible to produce a crack in the stack (laminate) element and that 100% of Pt did not allow the piezoelectric ceramics to be bonded well to the electrode layers, thus readily causing peeling of the stack (laminate).

Since the melting point of Au (gold) is relatively low, the baking temperature was set near 1000° C. There were, however, practical problems that partial melting of electrode layer occurred and that satisfactory stack (laminate) elements obtained were not so many.

From the foregoing it was found that when silver, normally used well, was contained in a large amount not less than 50% by weight, the drop occurred in the Q value and the performance of stack (laminate) element was not satisfactory. A conceivable reason thereof is possibly that silver is a relatively soft metal.

Taking the cost into consideration, Pd (palladium) is more desirable than Pt (platinum).

As for the thickness of electrode layer, it was determined to be 3 to 5 $\mu$m in this example, but further increase of thickness lowered the Q value. Therefore, the thickness of electrode layer is desirably as thin as possible within the scope where electrical conduction can be assured.

In order to increase the Q value, experiments were conducted to add another element, another inorganic substance, or the like for the purpose of changing the characteristics of electrode layer. However, no outstandingly big effect was achieved because they were not mixed well in the electrode layers, for example, because they were absorbed by the piezoelectric ceramics upon baking.

Commercially available powder of sub-$\mu$m to 2–3 $\mu$m was used for the electrode material. Investigation was carried out with other powder having different particle sizes of powder and made by different production processes, but no big difference was observed.

As described in the conventional example, if the stack (laminate) element is made using the piezoelectric ceramics with large damping of vibrational energy due to vibration (thus having a small value of mechanical quality factor $Q_m$), generation of heat due to damping will occur irrespective of chemical components of electrode material, which will cause a drop in the value of mechanical quality factor $Q_m$ of the stack (laminate) element. The value of mechanical quality factor $Q_m$ of the piezoelectric ceramic itself used in the present embodiment and the subsequent embodiments was about 1200 and it was found that piezoelectric ceramics of approximately 1400 and 2000 achieved better values of mechanical quality factor $Q_m$ of FIG. 5, for example (2000 is almost the limit of the value of mechanical quality factor $Q_m$ with the presently commercially available materials.)

On the other hand, values of mechanical quality factor $Q_m$ not more than 1000, e.g. of several hundred or several ten level, were not preferred as described above, and they were thus determined not to be used.

(Second Embodiment)

FIGS. 6A to 6F are plan views of piezoelectric ceramics composing the stack (laminate) element 11" to show the second embodiment of the present invention.

The configuration of stack (laminate) element 11" of the present embodiment is composed of the first layer, the second layer, the third layer, . . . in the order of FIG. 6A, FIG. 6B, FIG. 6C, . . .

The stack (laminate) element of the present embodiment is driven by two types of electric inputs. These electric inputs will be referred to as phase A and phase B. The stack (laminate) element of the present embodiment is driven in the mode of in-plane bending wherein nodes and antinodes appear alternately in the circumferential direction.

The stack (laminate) element of the present embodiment is a lamination of six piezoelectric ceramics of an annular shape as shown in FIGS. 6A to 6F, in which electrode layers and through electrodes (electrodes in holes filled with an electroconductive material so as to permit electric conduction) 30 are formed on one surface side of piezoelectric ceramic. There are some portions electrically insulated from the through electrodes 30 by providing portions 31 where no electrode layer is formed.

As shown in FIGS. 6B, 6D, and 6F, the electrode layers are formed at intervals of a quarter of the wavelength throughout the entire circumference on the second, fourth, and sixth layers of piezoelectric ceramics 42, 43. These electrode layers are arranged totally at the intervals of a quarter of the wavelength in phase A and in phase B by placing positive poles 32 (33) A (+) and negative poles 32 (33) A (−) of phase A and positive poles 32 (33) B (+) and negative poles 32 (33) B (−) of phase B every other pole.

On the third a fifth layer of piezoelectric ceramics 46 shown in FIG. 6C and FIG. 6E, GND electrodes 36A and 36B functioning as the ground of each phase are formed alternately at intervals of a quarter of the wavelength, positionally in the same phase as the electrodes of phase A and phase B of the piezoelectric ceramics 42 are positioned above and below them.

Electrode layers for polarization and for supply of power are formed concentrically in six rounds on the first layer of piezoelectric ceramic 44 as the uppermost layer, and two power supply electrodes 34AG and 34BG on the inner periphery side are connected to the electrode layers of the third and fifth layers of piezoelectric ceramics 46 by the through electrodes 30 formed in the thickwise direction in the piezoelectric ceramics. More specifically, the power supply electrode 34AG is connected to the GND electrodes 36A for phase A, while the power supply electrode 34BG to the GND electrodes 36B for phase B.

The power supply electrodes 34A (+), (−), 34 (+), (−) are connected similarly by the through electrodes 30 to the associated electrodes 32 (33) A (+), (−), 32 (33) B (+) (−) in the same phase and the same polarity of the second, fourth, and sixth layers of piezoelectric ceramics 42, 43.

Figure 7:
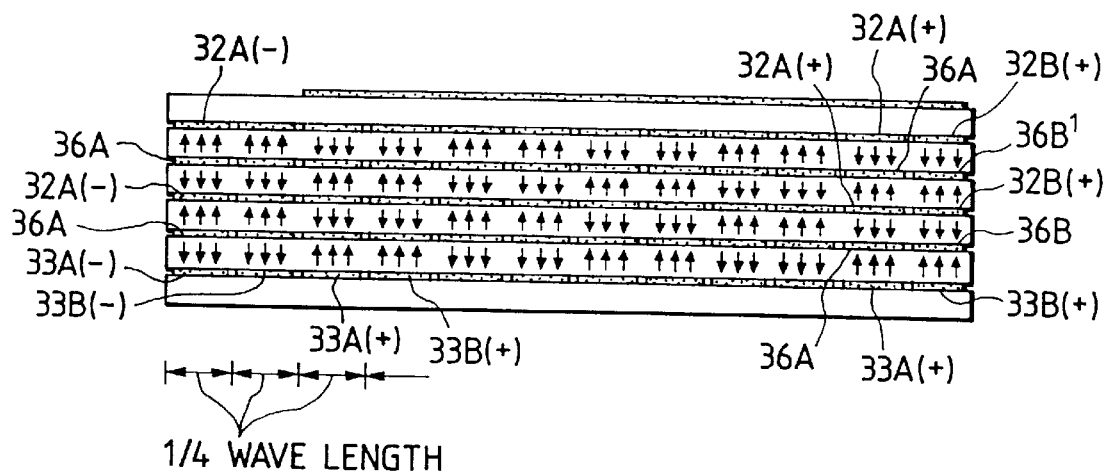
FIG. 7 Is a side view of FIGS. 6A to 6F.

FIG. 7 is a development to show the polarization states of the stack (laminate) element after subjected to the polarization process, wherein arrows indicate directions of polarization.

Contact pins for the polarization process are all in contact with the electrodes of the uppermost layer of piezoelectric ceramic 44, and the voltage is applied to the power supply electrodes 34AG, 34BG so that a positive voltage is applied to the positive power supply electrodes 34A (+), 34B (+) of phase A and phase B and a negative voltage to the negative electrodes 34A (−), 34B (−) of phase A and phase B.

Here, through the through electrodes 30 formed in each piezoelectric ceramic layer, the electrode layers 36A, 36B of the third and fifth layers of piezoelectric ceramics 46 are kept at the same potential as the power supply electrodes 34AG, 34BG of the first layer.

Similarly, the voltage for the polarization process, which is the same potential as the power supply electrodes 34A (+), B (+) of the uppermost layer of piezoelectric ceramic 44 have, is applied to the positive electrodes 32 (33) A, B (+) of the second, fourth, and sixth layers of piezoelectric ceramics 42 disposed on either side of these third and fifth layers of piezoelectric ceramics 46, while the voltage for the polarization process, which is the same potential as the power supply electrodes 34A (−), B (−) of the uppermost layer of piezoelectric ceramic 44 have, is applied to the negative electrodes thereof 32 (33) A, B (−).

When a positive electric field is applied to the power supply electrode 34A (+) with respect to the power supply electrode 34AG, the piezoelectric ceramic regions between the electrode lays 36A and 32 (33) A (+) expand in the thickwise direction; when the positive electric field is applied to the power supply electrode 34A (−) with respect to the power supply electrode 34AG, the piezoelectric ceramic regions between the electrode layers 36A and 32 (33) A (−) contract in the thickwise direction. When an alternating electric field is applied to these power supply electrodes, expansion and contraction is repeated to induce vibration. These are driven in phase A. Phase B is also constituted in the s manner.

Figure 8:
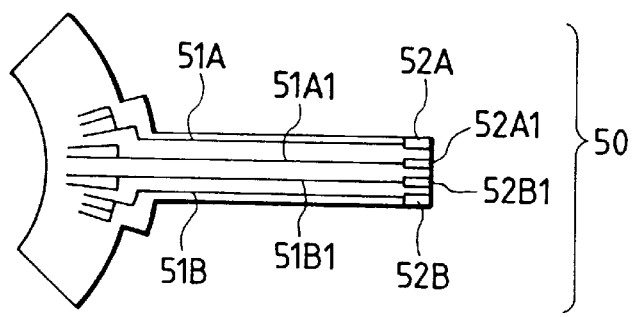
FIG. 8 is a flexible printed board used in the second embodiment.

A flexible printed board 50 connected to the power supply electrodes of this stack (laminate) element is constructed as shown in FIG. 8 so that a power supply pattern 51A1 is connected to the power supply electrode 34AG and a power supply pattern 51B1 to the power supply electrode 34BG. The drive voltage is supplied as follows from an unrepresented drive circuit through respective terminal portions 52A1, 52B1 to these two power supply patterns 51A1, 51B1.

Namely, a phase difference between the potentials of drive voltage supplied to the terminal portion 52A electrically conductive through the power supply pattern 51A with the power supply electrode 34A (+), (−) and the terminal portion 52B electrically conductive through the power supply pattern 51B with the power supply electrode 3B (+), (−) is +90 deg or −90 deg, and a phase difference between voltages of drive frequency supplied each between the terminal portions 52A and 52A1 and between the terminal portions 52B and 52B1 is 180 deg.

Execution of such power supply will excite two vibrations of different positions and different phases in the stack (laminate) element.

(Third Embodiment)

Figure 9:
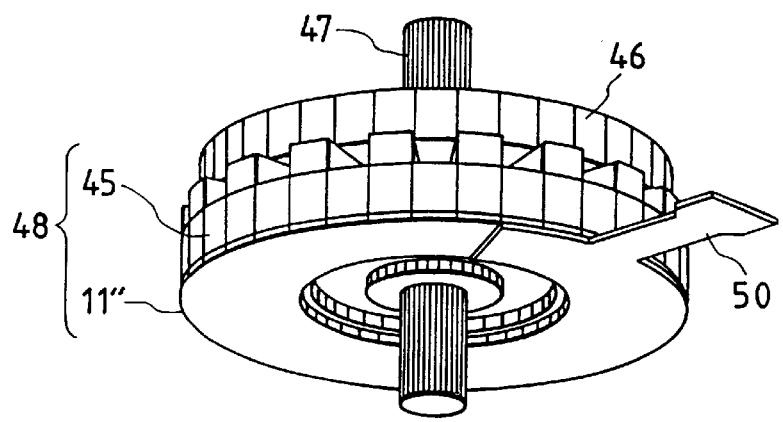
FIG. 9 is a perspective view of the vibration wave motor in the third embodiment.

FIG. 9 is a perspective view of a vibration wave motor which is one of the vibration drive apparatus using the stack (laminate) element of the first or second embodiment.

A vibrating body 45 is made in a disk shape and of a metal material and a comb tooth portion for enlarging displacement of vibrator is provided on one end face thereof. The stack (laminate) element 11" is bonded to the other end face of vibrating body 45 by an adhesive or the like. A flexible printed board 50 is bonded to the stack (laminate) element 11" and is electrically connected with the outside, thus forming a vibration generating device 48.

A moving body 46 is concentrically in press contact with the comb tooth portion of the vibrating body 45. Press of the moving body 46 against the vibrating body 45 is effected by an unrepresented press spring attached to an output shaft 47.

An electric input to the vibration generating device 48 causes vibratory deformation in the vibration generating device 48, so that force to rotate the moving body 46 appears in the comb tooth portion. Rotary motion of the moving body 46 is transmitted to the output shaft 47 and the output shaft 47 outputs rotational force.

Performance of the vibration wave motor was checked using ratios of silver to palladium being the weight ratios of 80:20 and 20:80 for the electrode layers of the above stack (laminate) element. The motor efficiency, which is a ratio of output of motor (torque×rpm) to input into motor, was 25% in the case of 80:20 under the rated conditions of this motor, torque 225 gcm and the number of revolutions 800 rpm, whereas the motor efficiency was 45% in the case of 20:80 under the rated conditions. Thus, there was a difference of 20%. This difference turned to be a difference of heat generation amount of motor as it was. In the case of 80:20, an increase of temperature of vibrator 48 was considerable, approximately 100 to 120° C. Operation for a long duration often caused peeling of the stack (laminate) element 11' bonded by the adhesive, from the vibrating body 45.

As described above, the embodiments realizes the stack (laminate) elements that are low in energy losses upon drive, high in output as a result, and little in generation of heat.

Use of the stack (laminate) piezoelectric elements shown in the embodiments realizes vibration drive devices that have higher output and less generation of heat than use of the ordinary stack (laminate) piezoelectric elements does.

Especially, the effects are great in the case of vibrating systems involving deformation such as bending or torsion.

What is claimed is:

1. A stack element comprising:

a plurality of layers of an electromechanical energy transducing material; and layers of an electrode material stacked alternately with said layers of the energy transducing material, wherein said electrode material contains silver in a metal component and said silver is less than 50% by weight and contains 50 or more % by weight of palladium, and wherein said stack element is subjected to a polarization process with said plurality of layers of the electrode material, with each of said plurality of layers of the electrode material being divided into a plurality of areas, and said plurality of areas polarized in different directions, with said stack element vibrating based on a combination of plural bending vibrations.

2. A device according to claim 1, wherein alternating electric fields with shifted phases are applied to said stack element, thereby vibrating said stack element.

3. An element according to claim 1, wherein a piezoelectric ceramic is used as said energy transducing material.

4. An element according to claim 1, wherein said stack element is subject to said polarization process after sintering.

5. An element according to claim 1, wherein said plurality of layers of the electrode material are electrically connected by an electroconductive material filled in a hole through said layers of the energy transducing material.

6. An element according to claim 1, wherein a shape of a layer of said electrode material being an uppermost surface or a lowermost surface of said stack element is different from a shape of the other layers of said electrode material located in between.

7. An element according to claim 6, wherein said layer of said electrode material being said uppermost surface or said lowermost surface is used for input of an electric signal.

8. A vibration drive device comprising:

a stack element in which a plurality of layers of an electromechanical energy transducing material and layers of an electrode material are stacked alternately; and a vibrating body arranged to vibrate with vibration of said stack element, wherein said electrode material contains silver in a metal component and said silver is less than 50% by weight and wherein said stack element is subjected to a polarization process with said plurality of layers of the electrode material after sintering, with each of said plurality of layers of the electrode material being divided into a plurality of areas, and said plurality of areas polarized in different directions, with said stack element vibrating based on a combination of plural bending vibrations.

9. A device according to claim 8, wherein said electrode material contains 50 or more % by weight of palladium, in addition to said silver.

10. A device according to claim 9, wherein said vibration drive device has a contact member in contact with said vibrating body and said contact member is moved relative to said vibrating body by vibration occurring in said vibrating body.

11. A device according to claim 8, wherein said plurality of layers of the electrode material are electrically connected by an electroconductive material filled in a hole through said layers of the energy transducing material.

12. A device according to claim 8, wherein a piezoelectric ceramic is used as said energy transducing material.

13. A device according to claim 8, wherein a shape of a layer of said electrode material being an uppermost surface or a lowermost surface of said stack element is different from a shape of the other layers of said electrode material located in between.

14. A device according to claim 13, wherein sad layer of said electrode material being said uppermost surface or said lowermost surface is used far input of an electric signal.

15. A device according to claim 14, wherein a printed board for input of said electric signal is put in contact with said stack element.

16. A device according to claim 8, wherein a vibration system comprising said stack element is vibrated near resonance.

17. A device according to claim 16, wherein an alternating electric field is applied to said stack element, thereby vibrating said stack element.

* * * * *

UNITED STATES PATENT AND TRADEMARK OFFICE
CERTIFICATE OF CORRECTION

PATENT NO. : 6,114,798

DATED : September 5, 2000

INVENTOR(S): YUTAKA MARUYAMA, ET AL.

It is certified that error appears in the above-identified patent and that said Letters Patent is hereby corrected as shown below:

COLUMN 2:

Line 40, "draws." should read --drawing.--.
    Line 60, "fasting" should read --fastening--.

COLUMN 3:

Line 51, "is" should be deleted.

COLUMN 5:

Line 17, "preliminary" should read --preliminarily--.
    Line 53, "sample 2)," should read --(sample 2),--.

COLUMN 6:

Line 45, "example (2000" should read --example. (2000--.

COLUMN 7:

Line 16, "a" should read --and--; and "layer" should read --layers--.
    Line 32, "34BG to" should read --34BG is connected to--.
    Line 36, "B(+)(-)" should read --B(+), (-)--.

UNITED STATES PATENT AND TRADEMARK OFFICE
CERTIFICATE OF CORRECTION

PATENT NO. : 6,114,798

DATED : September 5, 2000

INVENTOR(S): YUTAKA MARUYAMA, ET AL.

It is certified that error appears in the above-identified patent and that said Letters Patent is hereby corrected as shown below:

COLUMN 7 (con't.):

Line 40, "after subjected" should read --after being subjected--.

COLUMN 8:

Line 11, "s manner." should read --same manner--.
    Line 25, "electrode 3B(+)," should read --electrode 34B(+),--.
    Line 64, "turned" should read --turned out--.

COLUMN 10:

Line 36, "said" should read --said--.

Signed and Sealed this

Eighth Day of May, 2001

Attest:

NICHOLAS P. GODICI

Attesting Officer      Acting Director of the United States Patent and Trademark Office